United States Patent [19]

Akihama et al.

[11] Patent Number: 5,126,165
[45] Date of Patent: Jun. 30, 1992

[54] LASER DEPOSITION METHOD AND APPARATUS

[75] Inventors: Kazuhiro Akihama; Yoshimi Kizaki, both of Nagoya; Noboru Takayanagi, Toyota, all of Japan

[73] Assignees: Kabushiki Kaisha Toyota Chuo Kenkyusho, Aichi; Toyota Jidosha Kabushiki Kaisha, Toyota, both of Japan

[21] Appl. No.: 549,115

[22] Filed: Jul. 6, 1990

[30] Foreign Application Priority Data

Jul. 6, 1989 [JP] Japan .................................. 1-176388
Aug. 22, 1989 [JP] Japan .................................. 1-215420
Jan. 25, 1990 [JP] Japan .................................. 2-16796

[51] Int. Cl.$^5$ .................... B05D 3/06; B05D 5/12; C23C 16/00; C23C 14/00
[52] U.S. Cl. .................... 427/53.1; 427/250; 427/124; 118/726; 118/50.1; 118/641
[58] Field of Search ................ 427/53.1, 42, 248.1, 427/250, 124; 118/50.1, 620, 641, 708, 712, 720; 204/192.11; 219/121.66, 121.65, 121.6

[56] References Cited

U.S. PATENT DOCUMENTS

| 4,281,030 | 7/1981 | Silfuast ..................... 427/53.1 |
| 4,619,691 | 10/1986 | Araya et al. .............. 75/0.5 |
| 4,701,592 | 10/1987 | Cheung ...................... 427/53.1 |
| 4,921,348 | 5/1990 | Yeung et al. ............. 356/128 |
| 4,987,007 | 1/1991 | Wagal et al. ............. 427/42 |
| 5,015,492 | 5/1991 | Venkatesan et al. ...... 427/53.1 |
| 5,017,277 | 5/1991 | Yoshida et al. ........... 427/53.1 |
| 5,019,552 | 5/1991 | Balooch et al. .......... 427/53.1 |

FOREIGN PATENT DOCUMENTS 59-116373 7/1984 Japan .
64-43929 2/1989 Japan .

OTHER PUBLICATIONS

Lynds et al, "Superconducting Thin Films of (RE)Bu$_2$Cu$_3$YAg)O$_{7-x}$ Prepared by Pulsed Laser Ablation", Mat. Res. Soc. Symp. Proc., vol. 99, Nov. 1987.
Wu et al, "A Simple Method to Prep. High Tc Supercond. Thin Films: Pulsed Laser Deposition", Chem. of Oxide Supercond., Rao ed., Blackwell Sci. Pub. 1988.
Venkatesan et al, "Obs. of 2 Distinct Components During Pulsed Laser Deposition of High T$_c$ Superconduct Films", Appl. Phys. lett, 52(14), Apr. 1988.
Sankur et al, "Formation of Dielectric & Semiconductor Thin Films by Laser-Assisted Evap.", Appl. Phys. A47, pp. 271-284, Nov. 1988.

Primary Examiner—Marianne Padgett
Attorney, Agent, or Firm—Oblon, Spivak, McClelland, Maier & Neustadt

[57] ABSTRACT

For forming a metal film of a desired property on a substrate, a target and the substrate are placed in a pressure-reducing chamber, and then pulse laser is irradiated to the target. This causes the component materials, such as ions, electrons, neutral atoms, cluster, fine grains and liquid drops, of the target to be emitted from the target, and then laser induced plasma is produced. These emissions of substances have spatial and timewise distribution determined by physical and chemical states. Then, a shielding plate having an opening is placed between the target and the substrate, and from the materials, only the material emitted in a predetermined direction is selected to control the property of the film deposited on the substrate. By locating a filter between the target and the substrate to open for a predetermined period of time, only the material emitted at a predetermined velocity can be selected. Further, by applying a predetermined d.c. voltage between the target and the substrate to control the spatial and timewise distribution of charged particles in the emitted materials, it is possible to control the velocity, order and quantity of the charged particles as the latter arrive at the substrate.

23 Claims, 15 Drawing Sheets

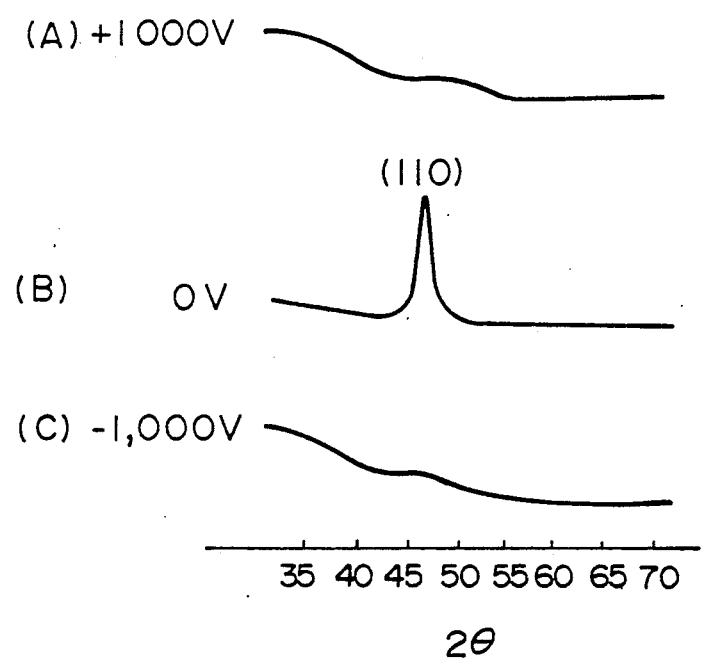

LASER DEPOSITION METHOD AND APPARATUS

BACKGROUND OF THE INVENTION

1. Field of the invention

This invention relates to a laser deposition method and apparatus in which laser light is irradiated to a target to generate a laser induced plasma such that only a part of the material, emitted from the target in a predetermined direction, is selectively deposited on a substrate.

2. Description of the Related Art

Heretofore, a variety of films and particularly thin films have been used as anti-reflection films for optical parts, such as camera lens, and also in surface coatings for ornaments. As great advances have recently been made in electronics, the irradiation deposition for thin films to the wiring of semiconductor devices, ICs, LSIs, etc. as well as to magnetic recording materials has been on the rise.

Further, upon progress of study on thin films, it has turned out that various peculiar effects such as tunneling effect could be achieved with thin films and also that shaping the material into a thin film could cause the structure of the material to change, depending on which various new functions and features could be provided. Accordingly, the significance of films is increasing throughout various fields.

Known film manufacturing technologies are exemplified by a vacuum deposition method in which particles of a film material are caused to evaporate in high vacuum and the evaporated particles are deposited over a substrate, and a sputtering method in which ions are irradiated to a target (an object) to cause atoms and molecules of the target surface to evaporate and then to be deposited over a substrate. Other film manufacturing technologies may be adopted depending on the kind of a film to be produced.

By utilizing plasma and ions in the conventional film production, the following effects can be obtained:

(1) It is possible to clean the substrate surface on which a film is to be formed, causing an improved degree of close adhesiveness.

(2) It is possible to control the property, such as crystallinity, of a film to be formed.

Following are methods for positively utilizing the above effects of plasma and ions:

(a) Ion plating method, in which evaporated particles are ionized in plasma, and accelerated by an electromagnetic field for deposition on the substrate.

(b) Cluster ion beam method, in which a cluster of about 1,000 atoms or molecules is formed by adiabatic expansion and ionized, then accelerated and deposited over the substrate.

(c) Ion beam method, in which ions formed in an ionization unit are irradiated to the target.

(d) Ion beam enhanced deposition method, in which particles are evaporated by an ion beam and ionized, then deposited on the substrate.

However, the above methods have several problems on preparations of thin films.

In the ion plating method (a) and the ion beam method (c), particles are evaporated and ionized by gaseous plasma and discharge of an inert gas such as argon. Therefore, these methods cannot be used in high vacuum so that impurities contained in the film can be minimized only inadequately. This is partly because inert gas contains impurities, which can be mixed in the film and partly because inert gas itself can be mixed in the film as impurities.

Further, in the ion plating method (a), the cluster ion beam method (b) and the ion beam enhanced deposition method (d), an evaporation source and ionization unit for evaporating a material are provided independently of each other, thus making the entire apparatus bulky and complex.

In addition, in any of the methods (a) through (d), since most of the ions of the film material to be evaporated are singly charged, it is impossible to produce a film of a peculiar characteristic in which multiply charged ions are selectively utilized. Also, there have been, heretofore, many restrictions to the selection of the material to be evaporated so that a film having a desired quality could not be formed.

Furthermore, in the case of a multilayer film composed of a plurality of superimposed films or a mixed film formed of a mixture of a plurality of materials, evaporation sources are needed one for each material to be evaporated, which makes the entire apparatus very bulky.

Another known method is a laser deposition method in which laser light is focused and irradiated to a target to evaporate an emitting material from the target so that evaporated particles are deposited on the substrate. This prior art method is exemplified by Japanese Patent Laid-Open Publications Nos. 116373/1984 and 43929/1989. In these prior laser deposition methods, since there is provided no means for selecting the emitting material emitted only in a predetermined direction, a film having an undesired characteristic would also be formed.

SUMMARY OF THE INVENTION

It is therefore a object of this invention to provide a laser deposition method and apparatus by which the desired structure of a film can be controlled, by selecting the emitting material emitted only in a predetermined direction and also by adjusting the velocity and quantity of the emitting material, which is selectively caused to pass as needed, depending on physical and chemical states and distributions thereof.

According to a first embodiment of this invention, there is provided a laser deposition apparatus comprising: a reducing chamber formed hermetically for keeping an interior thereof in a pressure-reduced state; a target holder disposed in the interior of the reducing chamber for holding a target; a laser for outputting laser light; a focusing means for focusing the laser light from the laser to irradiate the focused laser light to the target, so as to cause an emitting material to emit from the target and so as to generate laser induced plasma; a substrate holder for holding a substrate to which the emitting material emitted from the target is to be deposited; and a direction selecting means disposed in a traveling path of the emitting material passing through the target holder and the substrate holder, the direction selecting means being capable of selecting, from the emitting material emitted from the target, a part of the emitting material that is emitted within a given range of a predetermined angle.

According to a second embodiment of the invention, there is provided a laser deposition method comprising: placing a target and a substrate in a reducing chamber having an interior kept in a pressure-reduced state; focusing laser light and then applying it over the target to cause an emitting material to emit from the target and to generate laser induced plasma; selecting, from the emitting material emitted from the target, a part of the emitting material that is emitted only in a predetermined direction; and attaching the selected emitting material to the substrate.

For deposition, firstly the target capable of emitting a deposition material is attached to a target holder while the substrate on which surface a film is to be formed is attached to a substrate holder. Then gas in the airtight chamber is evacuated by a vacuum pump, for example, to keep the interior of the airtight chamber in a pressure-reduced state.

Subsequently, laser light is irradiated to the target from a laser. Preferably, the laser should radiate pulsed laser light, such as from an excimer laser, or laser light chopped from the continuous laser light. This laser light is focused on the surface of the target by an optical system, such as an optical lens, thus irradiating the laser light of a predetermined high energy.

By this irradiation of laser light ions or electrons and neutral atoms are emitted from the target, and then laser induced plasma is produced. The density of the laser induced plasma, for example, can be easily adjusted by varying, for example, the focusing degree of the optical system.

The emitting material emitted from the target is scattered in all directions, while a part of the emitting material flies toward the substrate and is deposited to the surface of the substrate.

The apparatus of this invention includes a selectively transmitting means for controlling the emitting material, which is to be deposited on the substrate, depending on the physical state of (velocity, mass, etc.) of the emitting material and also on the chemical state (singly charged and multiply charged ions, electrons, neutral atoms, etc.) of the emitting material. The selectively transmitting means may be an aperture, in the form of a shielding plate having an opening. They may also be in the form of a shielding plate having an opening for repeatedly opening and closing the opening at a predetermined time interval to select a part of the emitting material passing through the opening only at a predetermined time.

With this selectively transmitting means, only a part of the emitting material having passed the opening of the shielding plate is allowed to reach the surface of the substrate.

The emitting material emitted from the target varies in physical state such as velocity, mass, etc. and in direction of emission, depending on the chemical state such as the kind of the emitting material, thus causing a spatial component distribution of the emitting material based on this variation. The characteristic of the deposited film can be controlled by spatial selection by, for example, a shield plate having an opening. For example, by this spatial selection, it is possible to control the proportion of crystal phase, such as $\alpha$ phase and $\beta$ phase, of a tungsten deposition film.

Further, by locating, in a path from the target to the substrate, a rotating disk having an opening of an predetermined angle, it is possible to select only the emitting material which reaches the rotating disk in a predetermined time. Namely, as laser light is irradiated to the target, the various parts of the emitting material reach the rotating disk in the order of each part's velocity. Therefore, by opening and closing an opening in synchronism with irradiation of laser light and by opening the opening only for a predetermined time after irradiation of laser light, it is possible to select only that part of the emitting material which has a velocity corresponding to that time. For example, using molybdenum for the target, fine particles can be removed or only ions can be selected.

If a charged particle controlling means is employed for controlling spatial and timewise distribution of charged particles in the emitting material by adjusting the emitting state, such as by applying a predetermined voltage between the target and the substrate, it is possible to control, for example, the crystallinity of a deposited film by adjusting the velocity, order and quantity when the emitting material, which is emitted from the target, reaches the substrate, according to the chemical state of the emitting material. For example, if a voltage is applied in such a manner that the potential of the target is a positive or negative value with respect to the substrate, an electromagnetic field is formed in the traveling path of the emitting material so that ions having charge are accelerated or decelerated by this field. This varies the velocity, order and quantity of emitting material according to the chemical state of the emitting material, which is deposited to the substrate, so that the crystal structure of the film to be formed on the substrate surface will be changed. By varying the voltage established between the target and the substrate, it is possible to control the property, such as crystal structure, of the deposited film.

For example, if the potential of the target is less than $-1$ kV or more than 1 kV with tungsten used for the target, it is possible to form a film of small crystal particles on the substrate. If it is about 300 V, it is possible to form a tungsten film which is very good in crystallinity.

As described above, according to the laser deposition method and apparatus of this invention, the proportion of crystal phases and the crystal structure of the deposited film can be controlled. Therefore, a film having a desired proportion of crystal phases and a desired crystal structure can be obtained with a simple construction, and a film having a new structure selectively using multiple charged ions can be obtained. Accordingly, in various fields using films, it is possible to achieve new functions and features and to improve various functions.

The above and other advantages, features and additional objects of this invention will be manifest to those versed in the art upon making reference to the following detailed description and the accompanying drawings in which several preferred embodiments incorporating the principles of this invention are shown by way of illustrative example.

BRIEF DESCRIPTION OF THE DRAWINGS

FIG. 16 is a pattern diagram showing the result of X-ray diffraction of a sample amorphous tungsten film.

DETAILED DESCRIPTION

Various embodiments of this invention will now be described with reference to the accompanying drawings.

First Embodiment

Figure 1:
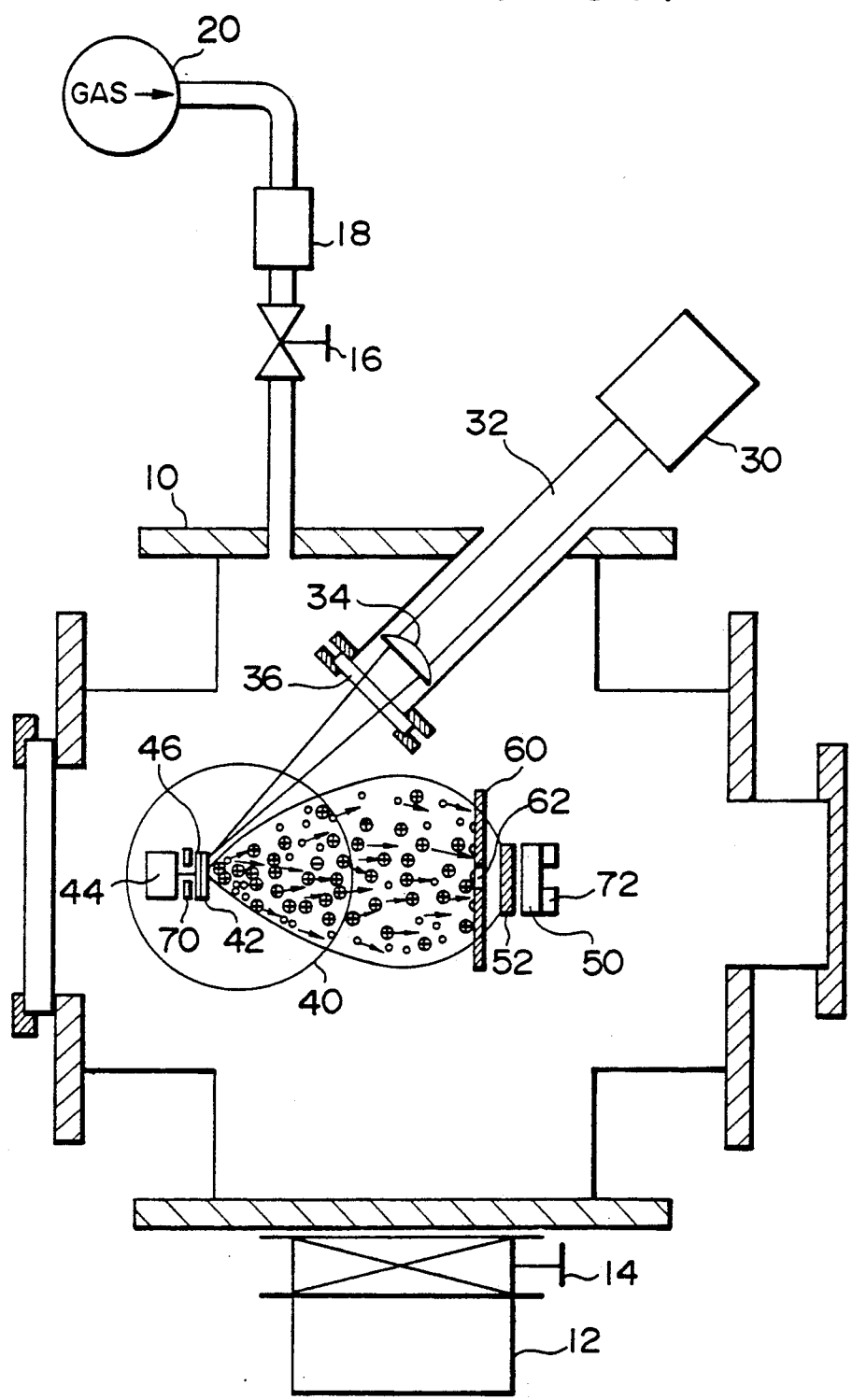
FIG. 1 is a schematic cross-sectional view showing main parts of a laser deposition apparatus according to a first embodiment of this invention.

FIGS. 1 through 4 show a laser deposition apparatus according to a first embodiment of this invention. As shown in FIG. 1, an airtight chamber 10 is a pressure-resistant chamber which is tightly closed to seal its interior from the exterior space. To the airtight chamber 10, a vacuum pump 12 is connected via a pressure regulator 14. By operating the vacuum pump 12, it is possible to cause the interior of the airtight chamber 10 to assume a pressure-reduced state. Usually, the internal pressure of the airtight chamber 10 is detected beforehand by means of a pressure detector (not shown), and the pressure regulator 14 ca be controlled to keep the interior of the airtight chamber 10 at a predetermined pressure. Thus, the interior of the airtight chamber 10 can be placed in a predetermined pressure-reduced state by the vacuum pump 12 and the pressure regulator 14.

Further, to the airtight chamber 10 a gas source 20 is connected via a valve 16 and a gas flow regulator 18 so that a desired gas from the gas source 20 can be introduced a predetermined amount at a time into the airtight chamber 10. Then the interior of the airtight chamber 10 can be kept in a predetermined gas atmospheric state.

A laser 30 radiates a predetermined laser light 32, using a pulsed excimer laser, for example. The laser light 32 passes a focusing lens 34 (optical system) and is then introduced into the airtight chamber 10 via a transmission window 36 formed in the airtight chamber 10.

Inside the airtight chamber 10, a rotary table 40 is mounted to support thereon a target 42. Specifically, to the rotary table 40 a secondary motor 44 is fixed. A target holder 46, to which the target 42 is secured, is fixed to a main shaft of the secondary motor 44.

Therefore, when applying laser light 32 to the target 42 by the focusing lens 34, it is possible to control the density of applying power of laser light, which is to be irradiated to the target 42, by adjusting the distance between the focusing lens 34 and the target 42. It is thereby possible to control the quantity and composition, e.g. ion quantity of the emitting material containing multiply charged ions of the emitting material and proportion of multiply charged ions, of the emitting material emitted from the target 42. In this invention, laser light is irradiated to the target 42 to generate plasma, and the density of this plasma also can be controlled by adjusting the density of irradiated power of laser light.

In order to prevent the concentrated damage on the target 42 by the irradiation of laser to a fixed point, the secondary motor 44 is driven to rotate the target holder 46. Namely, by rotating the target holder 46 to rotate the target 42, the laser light focused by the focusing lens 34 is irradiated to individual portions of the target 42. Thus the target can be prevented from the concentrated damage on the target.

Further, by rotating the rotary table 40 about its axis of rotation, it is possible to vary the angle of the laser light from the focusing lens 34 with respect to the target 42. Thus it is possible to control the direction of the emitting material emitted from the target 42.

A substrate holder 50 is disposed inside the airtight chamber 10 in such a position as to confront the target 42. A substrate 52 over which a film is to be formed by deposition is attached to the substrate holder 50.

In the first embodiment, a shielding plate 60 is provided on the front side of the substrate 52 as a selectively transmitting means serving as a deposition control means. This shielding plate 60 has an opening 62 is that the emitting material emitted from the target 42 is restricted to that passing through the opening 62; that is, the traveling path of the emitting material is restricted spatially to select the emitting material emitted in a predetermined direction. Therefore, the material to be deposited on the surface of the substrate 52 is limited to only that emitted from the target 42 in the direction of the opening 62. The components of the emitting material emitted from the target 42 have a predetermined distribution, and therefore, desired components of the emitting material can be selected according to the position of the opening 62 of the shielding plate 60 and can be deposited over the substrate 52.

Two temperature control units 70, 72 are respectively attached to the target holder 46 and the substrate holder 50 for controlling the respective temperatures of the target 42 and the substrate 52.

In the laser deposition apparatus of this embodiment, when laser light 32 is focused and irradiated to the target 42, laser induced plasma is produced and the emitting material is emitted from the target 42. This emitting material is composed of neutral particles, clusters, liquid particles, fine grains, ions including multiply charged ions of them, electrons, etc. The emitting material is emitted in a predetermined direction, depending on its components. Therefore, the material emitted from the target 42 has a particular spatial distribution depending on its components. Thus, it is possible to select a desired component according to the position of the opening 62 or the angle of the rotary table 40.

EXAMPLE 1

The experiment was actually conducted under the following conditions, using the apparatus of the first embodiment.

In this example, the target 42 was tungsten (W); the substrate 52, glass; the laser 30, KrF excimer laser (wavelength of 249 nm, pulse width of 16 nsec, pulse energy of 25 0 mJ); the repeating period of laser, 25 Hz;

the total pulse number of irradiation of laser the target 42, 30,000 pulses; the area of irradiation of laser to the target 42, $6 \times 10^{-3}$ cm$^2$; the rotational velocity of the motor 44, 20 rpm; the incident angle of laser light 32 with respect to the target 42, 45°; the temperature of the target 42 and the substrate 52, room temperature; the pressure of the airtight chamber 10, less than $1 \times 1^{-5}$ Torr. Any particular gas from the gas source 20 was not introduced into the chamber 10.

Further, the distance between the target 42 and the substrate 52 was 30 mm, and the shielding plate 60 was disposed in close contact with the substrate 52.

Under the foregoing conditions, the laser light 32 was focused and irradiated onto the target 42 to generate a laser induced plasma. Then from the target 42, neutral particles, clusters, ions including polyvalent ions and electrons were emitted in all directions. The emitting material flied also toward the substrate 52 and is deposited on the substrate 42.

The shielding plate 60 having the opening 62 was disposed in front of the substrate 52. Since the spatial distribution (emitting direction) of ions in the plasma varies depending on their number of charge, it was possible to control the ratio of an ions of individual number of charge (e.g., +1 charge, +2 charge, +3 charge) reaching the substrate, by selecting a particular direction by varying the position of the opening 62. Also, since the neutral atoms, clusters, fine grains, and liquid drops are different in spatial distribution, it was possible to control the ratio of charged particles and neutral particles reaching the substrate, by selection of a particular direction.

Figure 2:
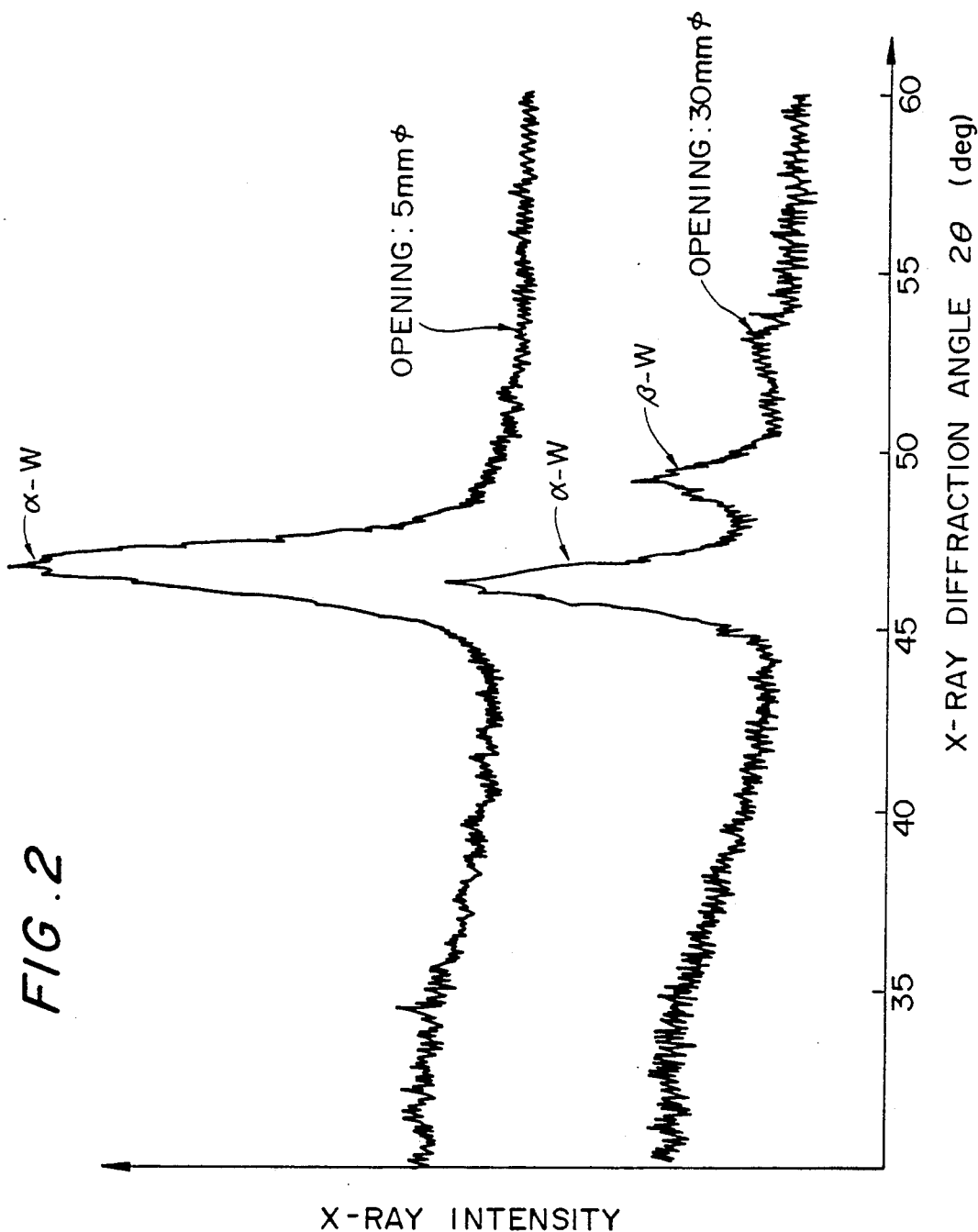
FIG. 2 is a characteristic view of X-ray diffraction of a tungsten film according to the first embodiment.

FIG. 2 shows the results of X-ray diffraction of the tungsten deposition film deposited on the substrate 52. In FIG. 2, the horizontal coordinate stands for diffraction angle $2\theta$ of X-ray, and the vertical coordinate stands for intensity of diffracted X-ray.

In the case where the size of the opening 62 was 30 mm (solid angle was 0.663 steradian), the tungsten deposited film has a peak in incident angle corresponding to $\alpha$ phase and $\beta$ phase, there existing mixed crystals of $\alpha$ phase and $\beta$ phase. On the other hand, in the case where the size of the opening 62 was 5 mm (solid angle was 0.022 steradian), only the component, of the emitting material, which was high in ion (including multiply charged ion) quantity and plasma density in particular was deposited. Therefore, the tungsten deposited film was $\alpha$ single phase. Thus, by using the spatial distribution of components of the emitting material, it was possible to select only a particular component by varying the size of the opening 62. Therefore, it was understood that the property of a film could be controlled. $CoK\alpha$ was used for the X-ray source.

The tungsten film thus obtained is suitable for use as wiring materials for IC and the like. At that time, the resistivity of the film should preferably be small. The resistivity of $\beta$ phase is larger than that of $\alpha$ phase. However, the existence of this $\beta$ phase is not desirable when the tungsten film is used as wiring materials. According to this invention, since only the emitting material emitted in a predetermined direction was selected, undesirable $\beta$ phase could be removed and a film of only $\alpha$ phase could be formed.

Further, by utilizing its high melting point, the tungsten film can be used for coating the surface of heat-resistant part or member. In using a tungsten film, its crystallinity and crystal structure are factors which dominate conductivity, heat resistance and corrosion resistance; the apparatus of this embodiment, which can control these factors, can perform a very important role in utilizing a tungsten film.

EXAMPLE 2

The experiment was conducted under the following conditions which are different from those in Example 1, using the apparatus of this embodiment.

Figure 3:
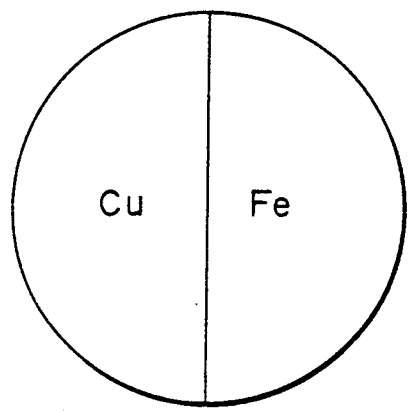
FIG. 3 is a diagram schematically showing one example of a target according to the first embodiment.

As shown in FIG. 3, the target 42 was a split type composed of copper (Cu) and iron (Fe). The substrate 52 was glass; the laser 32, ArF excimer laser (wavelength of 193 nm, pulse width of 16 nsec, pulse energy of 200 mJ); the repeating period of laser, 25 Hz; the total pulse number of irradiation of laser to the target 42, 30,000 pulses; the area of irradiation of laser over the target 42, $6 \times 10^{-3}$ cm$^2$; the incident angle of laser light 32 with respect to the target 42, 45°; the temperature of the target 42 and the substrate 52, room temperature; the pressure of the airtight chamber 10, less than $1 \times 10^{-5}$ Torr.

Under the foregoing conditions, the laser light 32 was irradiated onto the target 42 to generate a laser induced plasma. Then from the target 42, the emitting material and ions (including polyvalent ions) and electrons of iron and copper were alternately generated. This is true partly because the target 42 was composed of iron and copper as shown in FIG. 3, and partly because iron and copper were alternately irradiated by laser light 32 as the motor 44 was rotated. By controlling the rotational velocity of the target 42, various kinds of multilayer films can be formed. Namely, the film thickness is determined depending on the irradiating time; if the rotating velocity of the target 42 is increased, the frequency of irradiation alternately over iron and copper is also increased. As a result, the number of layers of a film is increased while the thickness of each layer is reduced.

Figure 4:
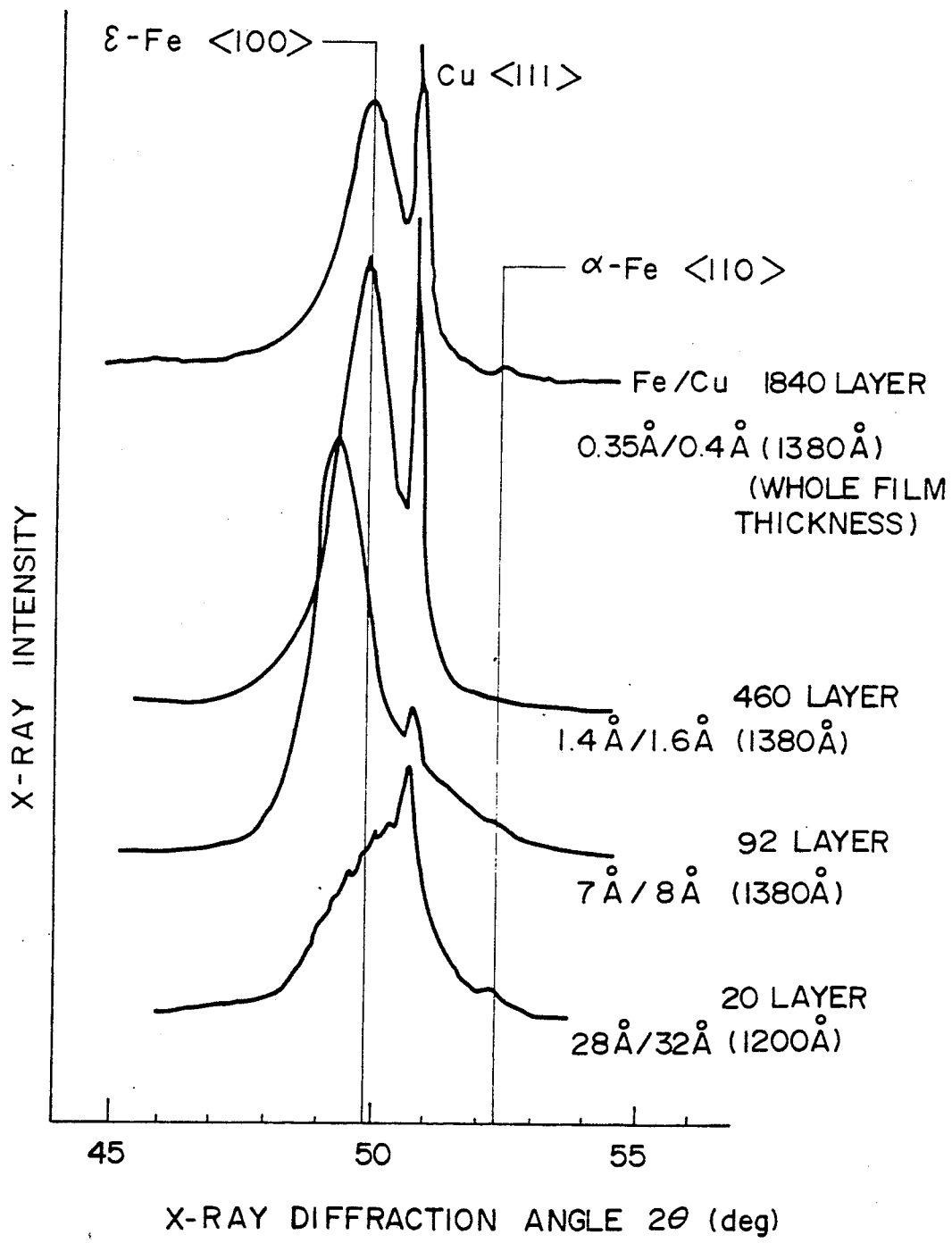
FIG. 4 is a characteristic view of X-ray diffraction of an Fe—Cu film according to the first embodiment.

FIG. 4 shows the results of X-ray diffraction when a multilayer deposited film composed of iron and copper was formed on the substrate 52 in close contact with the shielding plate 60 as the target 42 was rotated at various velocities. The size of the opening 62 was 5 mm, and the distance between the target 42 and the substrate 52 was 30 mm.

As is apparent from FIG. 4, when the multilayer film was composed of 1,840 layers, 460 layers, 92 layers or 20 layers of iron and copper as the rotational velocity was varied, it turned out that these multilayer films were different in construction. Specifically, the crystal structure of a multilayer film was varied according to the rotational velocity of the target 42. Regarding iron, phase stably existed in a multilayer film, which can be obtained only in a high-temperature and high-pressure state. Therefore, it will be understood that a film in a special construction was provided. Every deposited film was has a common thickness of 1,380 Å.

Further, if the target 42 is a split type of two or more kinds of materials, a mixed film can be formed according to the materials. By selecting a suitable proportion (area ratio) of separate materials of the target 42, it is possible to easily control the ratio of mixture of a multilayer film.

According to the first embodiment, it is possible to select, from the emitting material emitted from the target 42, a suitable component of the material to form a desirable deposited film.

If a reactive gas is introduced from the gas source 20 into the airtight chamber 10 and deposition takes place in the reactive gas, it is possible to increase the reactivity between ions, including polyvalent ions, of the emitting material and the gas so that reactive deposition can be performed in which the reactant is deposited on the substrate. For reactive gas, $O_2$, $O_3$, $N_2$, $CH_4$, $C_2H_2$ or other kind of gas may be selected depending on the kind of a film to be formed.

For manufacturing the target 42, various kinds of metals, alloy, ceramics, alumina, organic materials, liquid or gas may be absorbed in other solid surface. Accordingly, a desired film can be formed by selecting one from these various kinds of materials.

In this embodiment, since the apparatus has a temperature control unit 70, the target can be kept at a predetermined temperature. Therefore, it is possible to prevent the target from cracking due to a rapid temperature rise, so that scattering of gas or liquid from the solid material, in which the gas or liquid is absorbed, is prevented. Further, it is possible to control the crystal structure of a film by controlling the temperature of the substrate.

Generally, by selecting the method of superimposing layers to form a multilayer film, the materials to be superimposed, and the mixing ratio, it is possible to obtain a variety of properties which are possessed by none of materials existing in nature. If a multilayer film having a new property is obtained, it is expected that the film might perform a definitely novel function.

In addition, a multilayer film having a special magnetic property can be used as an optomagnetic recording material by making the film strong in vertical anisotropy.

Second Embodiment

Figure 6:
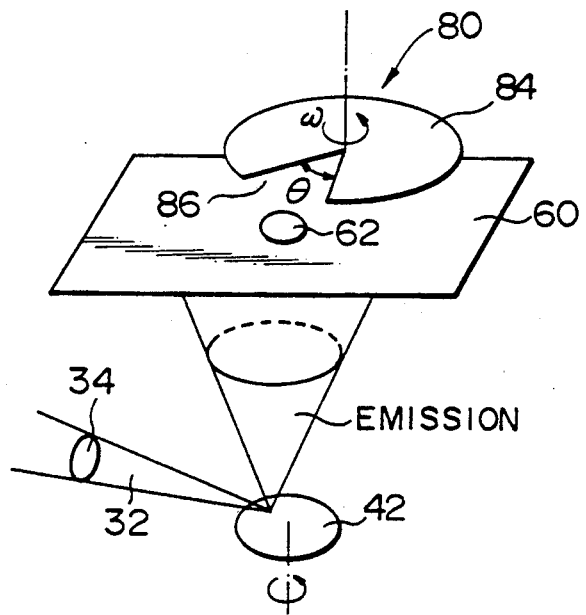
FIG. 6 is a schematic perspective view showing the construction of the second embodiment.
Figure 5:
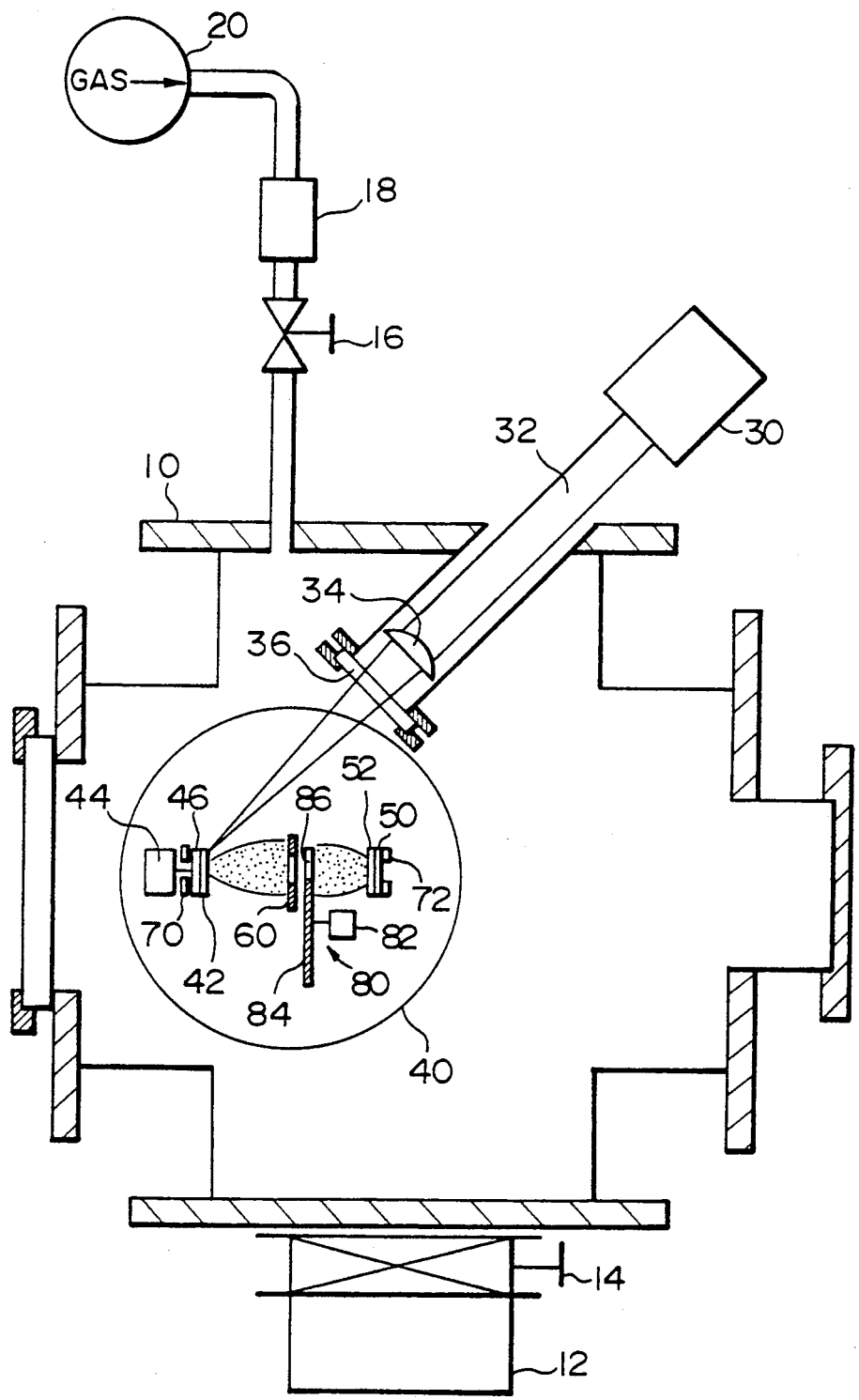
FIG. 5 is a view similar to FIG. 1, showing main parts of a modified laser deposition apparatus according to a second embodiment.
Figure 7:
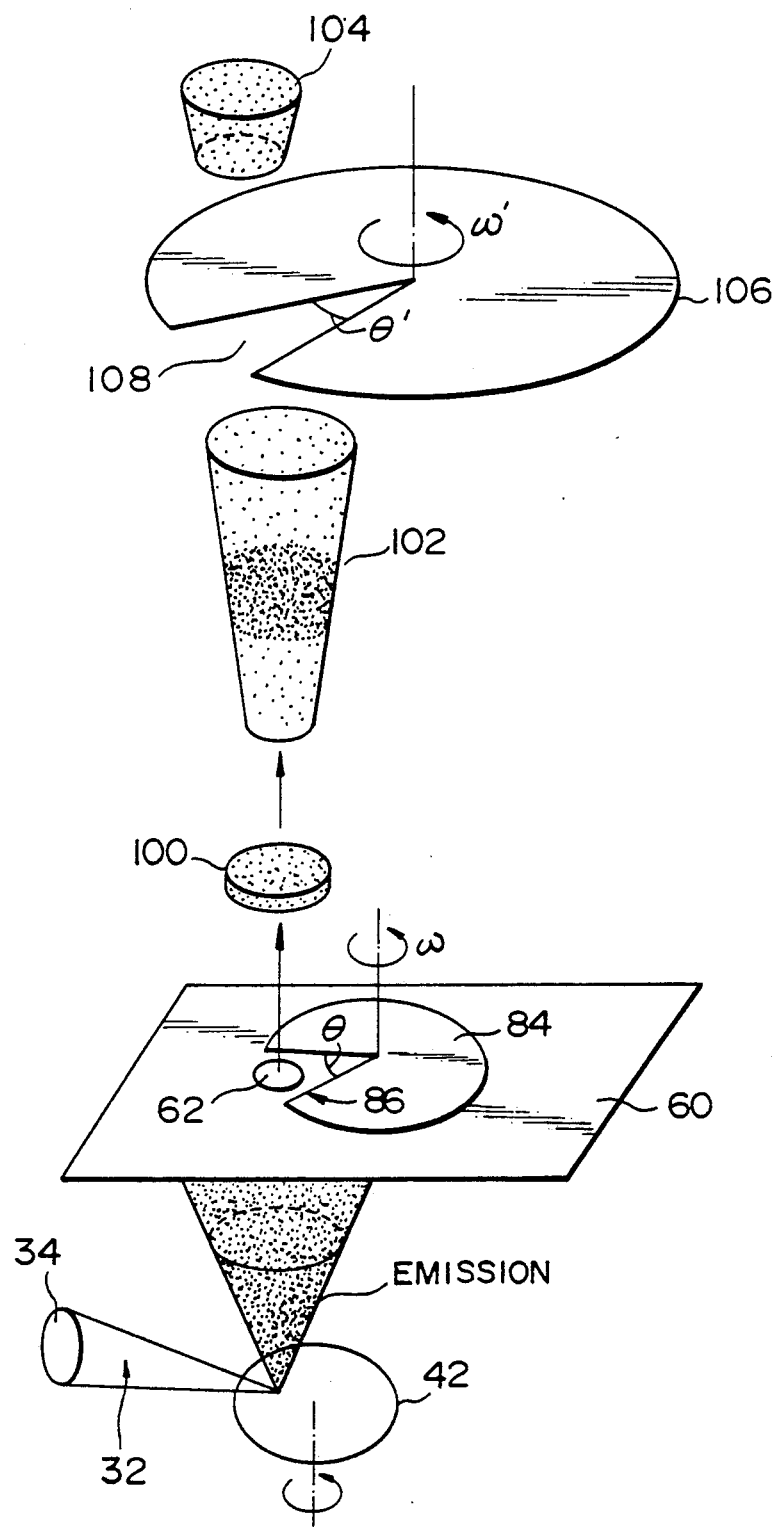
FIG. 7 is a schematic perspective view showing a modified construction of the second embodiment.

FIGS. 5 through 7 show a laser deposition apparatus according to a second embodiment. Like reference numerals designate similar parts throughout FIGS. 1 through 7.

For a significant feature of the second embodiment, as a selectively transmitting means which is a deposition means, there is provided a chopping element 80 for repeatedly shielding the substrate 52 from the target 42 and at a predetermined time interval to select the emitting material passing by in a predetermined time. The chopping element 80 is composed of a motor 82 and a rotary disk 84. The rotary disk 84 has an opening 86 of a predetermined angle of opening.

Specifically, in this example, as shown in FIGS. 5 and 6, the rotary disk 84 has a fan-shaped opening 86 which opens through an angle of $\theta$. The location of the chopping element 80 is such that the rotary disk 84 is disposed near the substrate side of the shielding plate 60.

Further, the target 42, the substrate 52 and other related parts are supported on the rotary table 40. In this embodiment, like the first embodiment, by rotation of the rotary table 40, it is possible to adjust the angle of the laser light 32 with respect to the target 42 so that the portion of the target facing toward the substrate 52 can be spatially selected.

In this apparatus, a pulse laser generator 30 such as excimer laser focuses and irradiates pulsed laser light to the target 42. Like the first embodiment, the emitting material is emitted from the target 42 to generate a laser induced plasma. The emitting material, that is emitted toward the substrate 52, passes through a predetermined opening 62 of the shielding plate 60.

In this embodiment, the chopping element 80 is located behind (downstream) the shielding plate 60, the rotary disk 84 of the chopping element 80 being rotated in synchronism with the pulse oscillating period of the laser 30. Therefore, selection can be made on the timewise distribution of the emitting material so that a desired component can be selected.

Specifically, by selectively varying, for example, the width (angle of opening $\theta$) of the opening 86 of the rotary disk 84 of the chopping element 80, the number of rotations of the rotary disk 84, the disk diameter, the repeating period of pulse laser, the distance between the target 42 and the velocity filter 80, it is possible to select, from the emitting material emitted from the target 42, only that emitted at a particular velocity. Therefore, selection of components utilizing timewise component distribution from the emitting material can be achieved.

Assuming that the velocity of the material (particles) emitted from the target 42 is v (cm/sec) and the distance between the target 42 and the velocity filter 80 is d (cm), the time $t_a$ taken for the material emitted from the target 42 to reach the velocity filter 80 is expressed by the following equation:

$$t_a = d/v.$$

On the contrary, assuming that the rotational velocity of the rotary disk 82 of the chopping element 80 is $\omega$ (rpm) and the angle $\theta$ (degree) of the opening 86, the time $t_p$ taken for the material emitted from the target 42 by irradiation of one pulse laser light 32 to reach the chopping element 80 is expressed by the following equation:

$$t_p = (60/\omega) \cdot \theta/360.$$

Further, assuming that the repeating period T (pulses/sec) of the laser light 32 is identical with the rotational period $\omega$ (rpm) of the velocity filter 80, the time $t_p$ is expressed by the following equation:

$$t_p = 360T.$$

Therefore, if the time $t_a$ taken for the emitted material to reach the chopping element 80 is equal to the time $t_p$ taken for the emitted material to pass the chopping element 80, it is possible to select only the material that is emitted at a velocity higher than the velocity v, for deposition on the substrate 52.

For this purpose, the distance d between the target 42 and the chopping element 80 may be set by the following equation:

$$d = (1/360) \cdot v \cdot \theta/T$$

The selection utilizing spatial component distribution by the opening 62 of the shielding plate 60 is identical with that in the first embodiment.

In the illustrated example, the laser light to be irradiated is pulse-like, but alternatively may be continuous. If the laser is oscillated continuously, the construction of FIG. 6 should be modified as shown in FIG. 7. Namely, in the case of continuous laser light, a plurality of rotary disks 84 are used in the chopping element 80, and the element 80 of FIG. 7 as that of FIG. 5 is supported on the rotary table 40.

As shown in FIG. 7, the rotary disk 84 has a fan-shaped opening 86 which opens through an angle $\theta$. The location of the chopping element 80 is such that the rotary disk 84 is disposed near the substrate side of the shielding plate 60.

In this example, the target 42, the substrate 52 and other related parts are supported on the rotary table 40. By adjusting the angle of laser light 32 with respect to the target 42, the portion of the target 42 facing toward the substrate can be spatially selected.

In this apparatus, the CW laser 30 such as large-output $CO_2$ laser is focused and irradiated to the target 42. Like the first embodiment, the material is emitted from the target 42, and laser induced plasma is generated there. The emitted material emitted toward the substrate 52 passes a predetermined opening 62 of the shielding plate. The chopping element 80 composed of a plurality of rotary disks is located behind the shielding plate 60.

By selecting, for example, the width (angle of opening $\theta$) of the opening 86 of the first rotary disk 84 of the chopping element 80, the number of rotations of the first rotary disk 84, the disk diameter, the distance between the target 42 and the chopping element 80, the bundle (or pack) of particles 100 is formed by the chopping of the continuous emission, which contains various velocity components, from the target 42 using the first rotary disk 84. In the bundle of particles 100 there are the materials having various kinds of velocities. The material travelling at a higher velocity reaches the second rotary disk 106 earlier, while that travelling at a lower velocity reaches the second rotary disk 106 later. As a result, the bundle of particles 102 extends spatially and has a particle distribution spatially corresponding to the velocity component of the various parts thereof. By selecting, for example, the width (angle of opening $\theta'$) of the opening 108 of the second rotary disk 106, the number of rotations of the rotary disk 106, its delay time, the disk diameter, the distance between the first rotary disk 84 and the second rotary disk 106, it is possible to obtain a bundle of particles of a given component of the bundle of particles 102, like the bundle of particles 104. For efficiency, the number of rotations of the second rotary disk is the same as that of the first rotary disk or a multiple thereof.

By using a plurality of rotary disks, even in the case of continuous laser light, it is possible to select a particular velocity component of the emitting material as in pulse-like generation.

As described above, the laser light of this embodiment may be either pulse or continuous. For the feature of this embodiment, laser light is focused and irradiated to the target, and the traveling path of the emitted material is restricted spatially and timewise, and the material emitted in a predetermined direction in a predetermined period of time is selected.

Experiment

The experiment was conducted by using the apparatus of the second embodiment. The results of this experiment are as follows.

In this experiment, the target 42 was molybdenum (Mo); the substrate 52, glass; the laser 30, KrF excimer laser (wavelength of 249 nm, pulse width of 16 nsec, pulse energy of 250 mJ); the internal pressure of the airtight chamber 10, less than $1 \times 10^{-5}$ Torr; the repeating period of laser pulse, 20 pulses/sec; the applying angle of laser light 32 with respect to the target 52, 45°; the total pulse number, 30,000; the area over which the laser light 32 is irradiated the target 42, $6 \times 10^{-3}$ cm$^2$; the rotational velocity of the target 42, 20 rpm; and the temperature of the target 42, room temperature.

Figure 8:
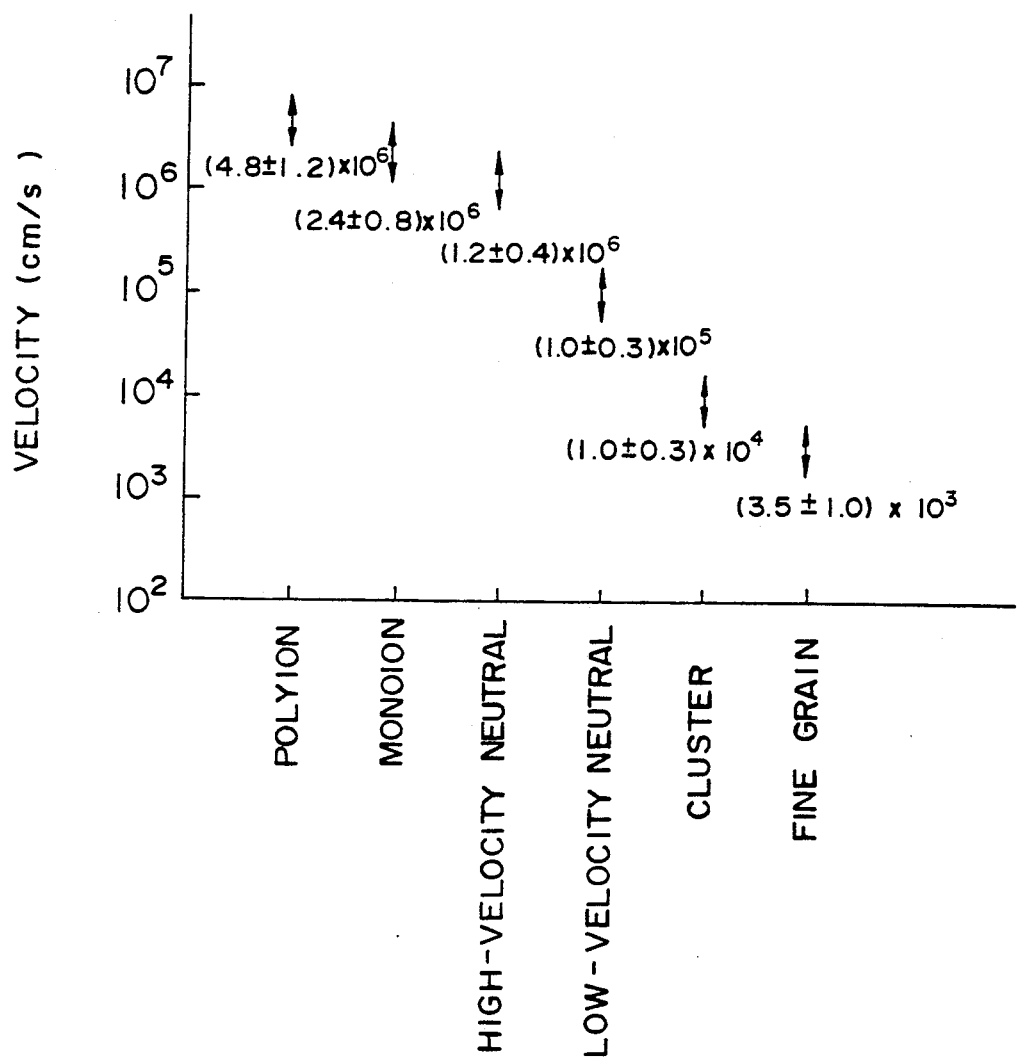
FIG. 8 is a graph showing the velocity distribution of materials emitted from a target.

Under the above conditions, vacuum deposition took place. The velocity distribution of the particles constituting the emitted material is shown in FIG. 8. By allowing the emitted material to pass the velocity filter 80 only after the lapse of a predetermined time from irradiation of laser pulses to the target, it is possible to select the emitted material which is to pass the chopping element 80. In other words, if the chopping element 80 is set to open for a very short time from irradiation of laser light 32 over the target 42, it is possible to select only multiply charged ions. If the chopping element 80 is set to open only a predetermined time thereafter, it is possible to select only singly charged ions.

Now, the experiment was conducted under the following conditions: the diameter of the opening 62 of the shielding plate 60 was 20 mm; the diameter of the rotary disk 84 of the chopping element 80, 30 mm; the angle $\theta$ of the opening 86 of the rotary disk, 5°; the number of rotations, 1,200 rmp; the distance d between the target 42 and the chopping element 80, 34.7 mm; the distance between the target 42 and the substrate 52, 40 mm; and the shielding plate 60 is disposed 2 mm ahead of the chopping element.

By synchronizing the pulsed laser light 32 with rotation of the chopping element 80, the emitted material is allowed to pass the chopping element 80 only in a predetermined period of time (0.7 msec) from the start of irradiation of the laser light to the target 42. Thus, the chopping element 80 allows only the material having a velocity of more than, $5 \times 10^3$ cm/sec, to pass in accordance with the time to pass.

As is apparent from FIG. 8, since fine grains are small in velocity, it is presumed that the fine grains in the deposited film can be reduced in number by the chopping element 80. To this end, deposition tests were conducted in the absence of and in the presence of the chopping element 80, and the density of fine grains was measured.

The density of fine grains in the presence of the chopping element 80 was 65/mm$^2$, while the density of fine grains in the absence of the chopping element 80 was $2.4 \times 10^3$/mm$^2$.

From the results of this experiment, it is understood that the chopping element 80 can eliminate the fine grains efficiently. This number of fine grains was measured by using SEM (Scanning Electron Microscope) photographs taken in the experiment.

Third Embodiment

Figure 9:
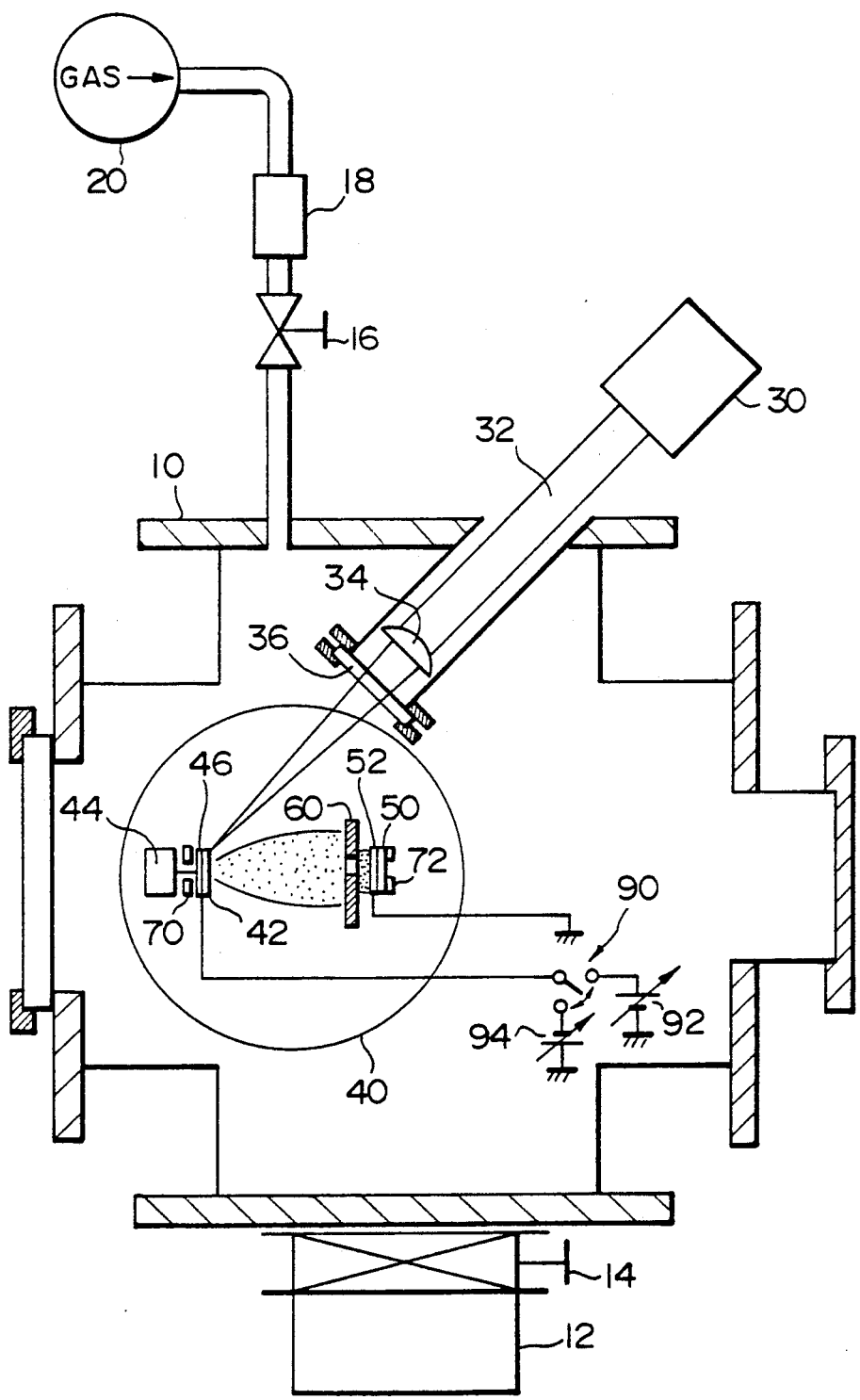
FIG. 9 is a view similar to FIGS. 1 and 5, showing main parts of another modified laser deposition apparatus according to a third embodiment.
Figure 10:
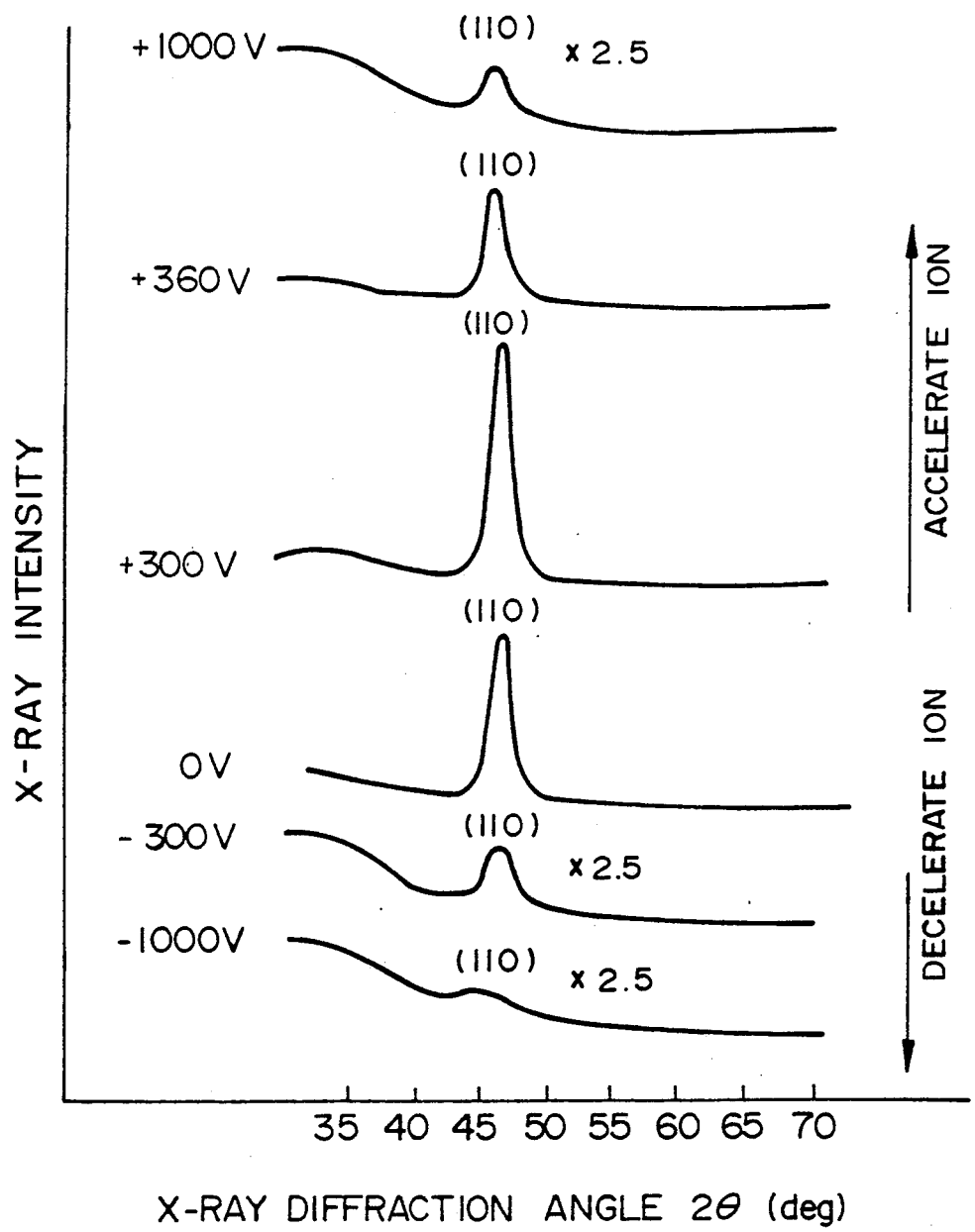
FIG. 10 is a characteristic view of X-ray diffraction of a tungsten film according to the third embodiment.

FIGS. 9 and 10 show a third embodiment. Like reference numerals designate similar parts throughout the first, second and third embodiments.

For the features of the third embodiment, the apparatus is provided with a voltage control means for controlling the velocity, kind and quantity of the emitting material according to its chemical state by maintaining the voltage between the target 42 and the substrate 52 at a predetermined level. The voltage control means is composed of a switch 90, a positive variable voltage source 92 or a negative variable voltage source 94. With this voltage control means, a voltage is applied to the target 42, and the substrate 52 is connected to the ground. Therefore, it is possible to give a predetermined positive or negative potential between the target 42 and the substrate 52. Further, since the output voltage value of each of the positive and negative voltage sources 92, 94 is variable, the target 42 can be set to a desired potential.

By applying a predetermined potential to the target 42 using the voltage sources 92, 94, it is possible to control, of laser induced plasma generated by laser light 32, only the charged particles of the material emitted in a predetermined direction selected by the opening 62 of the shielding plate 60. Specifically, if the potential of the target 42 is positive, ions emitted from the target 42 and passing through the shielding plate 60 are accelerated by the electromagnetic field established between the target 42 and the substrate 52. If the potential of the target 42 is negative, the ions passing through the shielding plate 60 are decelerated. Further, creating such field varies the acceleration depending on the number of charge and mass of ions to vary the spatial and timewise distribution of charged particles in the emitted material. The velocity, order and quantity of ions when reaching the substrate 52 vary depending on whether or not they are ions and on the number of charge and mass of ions. By varying the potential of the target 42, it is possible to control the property, e.g. crystallinity, of the film deposited on the substrate 52.

The potential of the shielding plate 60 is optional, and the function of the electromagnetic field lens as well as the selective transmission means may be added. Further, the number of openings or cylindrical tubes constituting the shielding plate 60 are not limited to the illustrated examples and may be settable according to the situation. Also the shape of the opening should by no means be limited to a circle as illustrated. Thus, this third embodiment features that a predetermined voltage is established between the target and the substrate and that the velocity, kind and quantity of the material are selected according to the chemical state of the material that is emitted in a predetermined direction.

Experiment

The experiment was conducted under the following conditions, using the apparatus of the third embodiment. In this experiment, the target 42 was tungsten (W); the substrate 52, glass; the laser 30, KrF excimer laser (wavelength of 249 nm, pulse width of 16 nsec, pulse energy of 250 mJ); the degree of vacuum inside the airtight chamber 10, less than $1 \times 10^{-5}$ Torr; the repeating period of pulse laser, 25 pulses/sec; the angle of irradiation of the laser light over the target 42, 45°; the total pulse number, 30,000; the area over which laser light is irradiated to the target 42, $6 \times 10^{-3}$ cm$^2$; the rotational velocity of the target 42, 20 rpm; the temperature of the target 42, room temperature; the temperature of the substrate 52, room temperature; and the distance between the target 42 and the substrate 52, 30 mm. Further, the opening 62 of the shielding plate 60 was $\phi 5$ mm; the distance between the substrate 52 and the shielding plate 60, 1 mm; and the potential of the shielding plate 60, ground.

Under the above condition, by giving the potential of $-1$ kV to 1 kV to the target 42, the velocity and quantity of the charged particles in the selected and transmitted material were controlled.

The results of X-ray diffraction of the tungsten deposited film obtained by this experiment are shown in FIG. 10. If no voltage is irradiated to the target 42, the tungsten film is high in crystallinity. But, when the potential of the target 42 was negative and its voltage was gradually increased, the crystallinity of the tungsten deposited film was gradually lowered. When the potential was $-1$ kV, it was non-crystalline. Reversely, when the potential of the target 42 was positive and was gradually increased, the crystallinity improving up to about 300 V. Beyond 300 V, the grain size of the crystal was reduced.

In this experiment, the temperature of the substrate 52 was room temperature. If the temperature of the substrate 52 was kept at 500° C., the film deposited on the substrate 52 became crystalline as the potential of the target 42 was in the range of $-3$ kV to 3 kV.

As described above, by applying a voltage between the target 42 and the substrate 52 and controlling the laser induced plasma, it is possible to control the crystal structure of the deposited film formed on the substrate 52. Further, since the property of a tungsten film is very dependent on its crystal structure, it is possible to obtain different kinds of films having various properties. For example, by reducing the crystal grains in size, it is possible to increase the degree of hardness of a film so that a film suited for abrasion-resistant and heat-resistant coating. In addition, improving the crystallinity means realizing a characteristic more suited for wiring materials.

Fourth Embodiment

Figure 11:
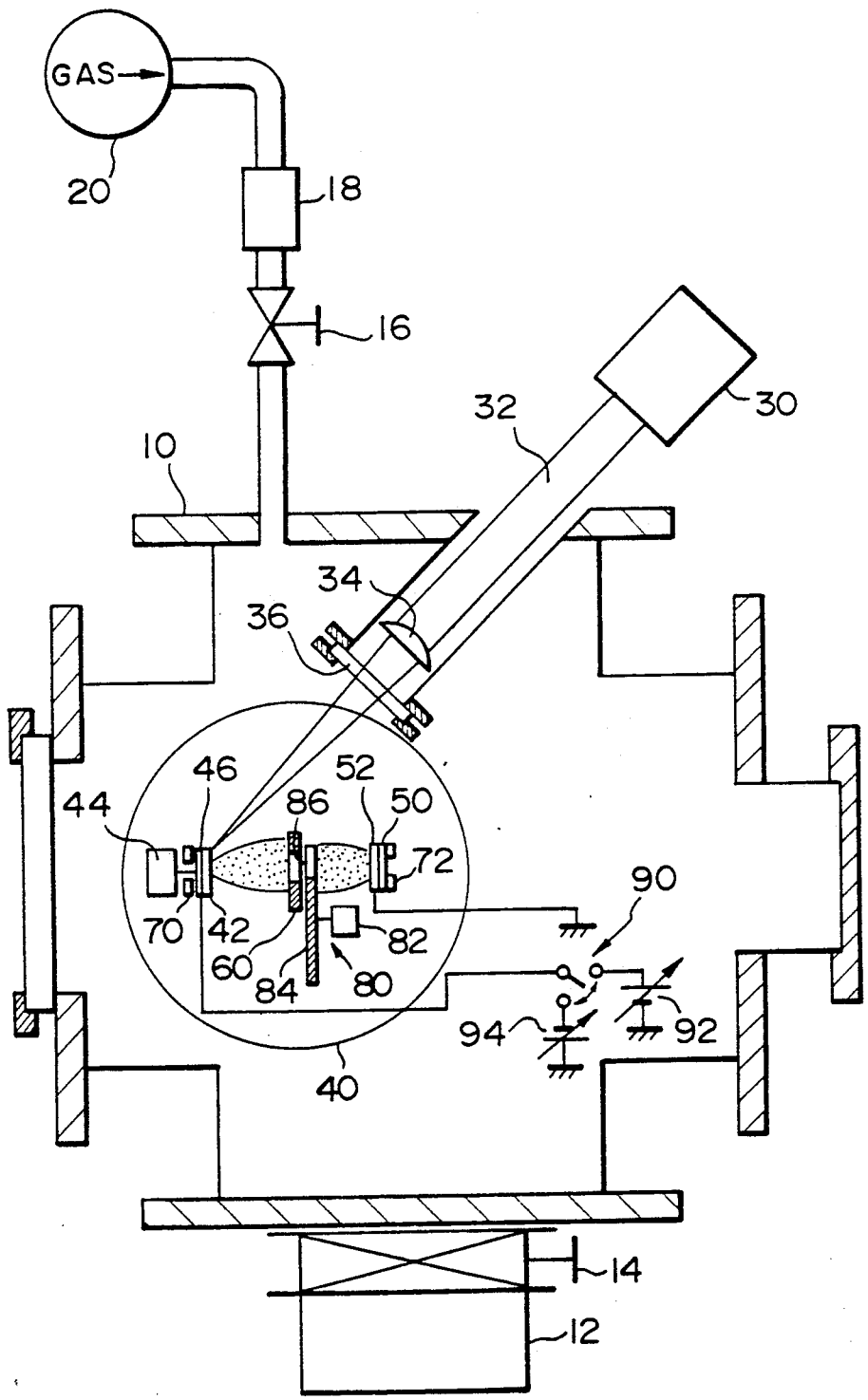
FIG. 11 is a view similar to FIGS. 1, 5 and 9, showing main parts of still another modified laser deposition apparatus according to a fourth embodiment.

FIG. 11 shows a fourth embodiment in which the chopping element of the second embodiment and the irradiated-voltage control means of the third embodiment are used.

According to the fourth embodiment, it is possible to select only the material which is emitted in a predetermined direction and at a predetermined velocity, and to control the velocity, order and quantity of the charged particles which reach the substrate. Therefore, the conditions for forming the film by deposition can be set in detail, and the construction of the film can be widely controlled.

Fifth Embodiment

Figure 12:
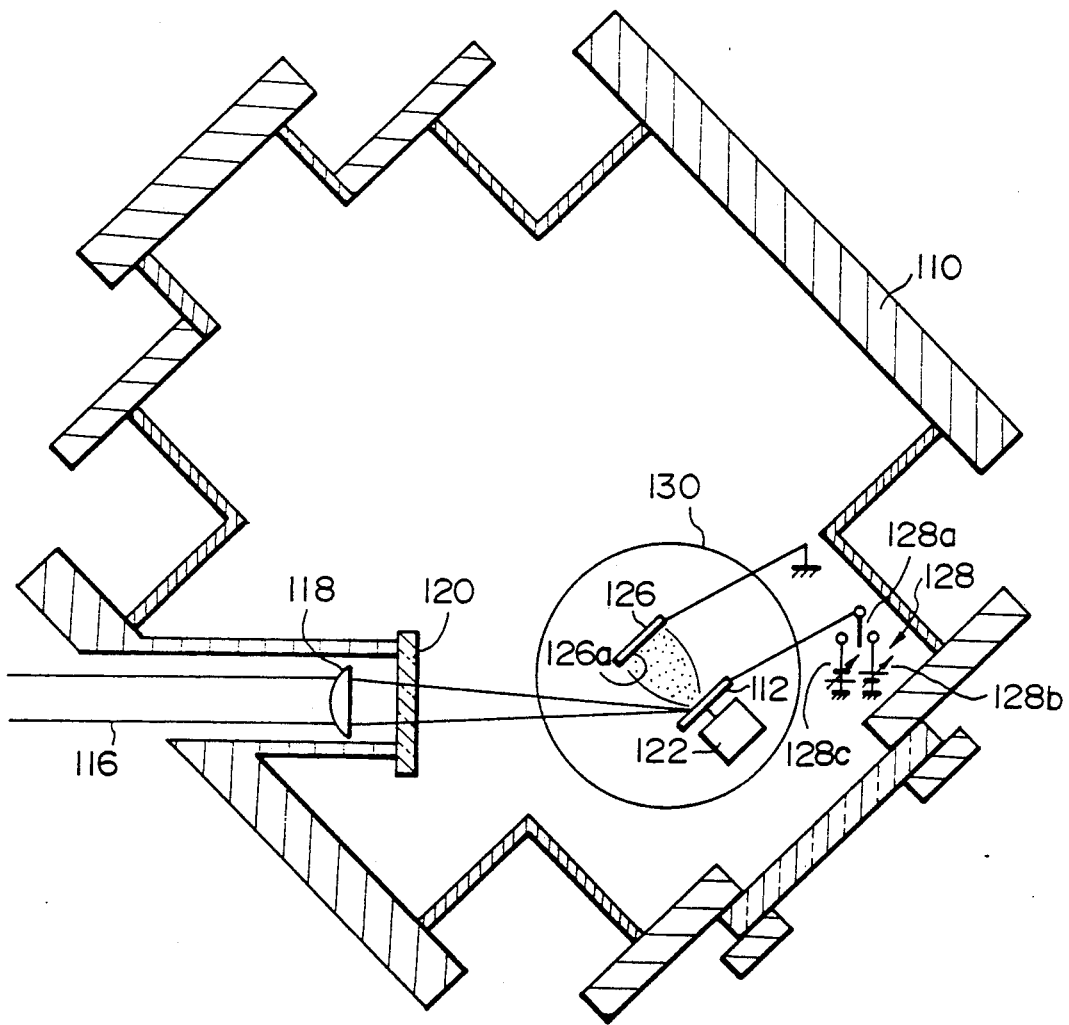
FIGS. 12 and 13 show an amorphous metal film producing apparatus embodying this invention.
Figure 13:
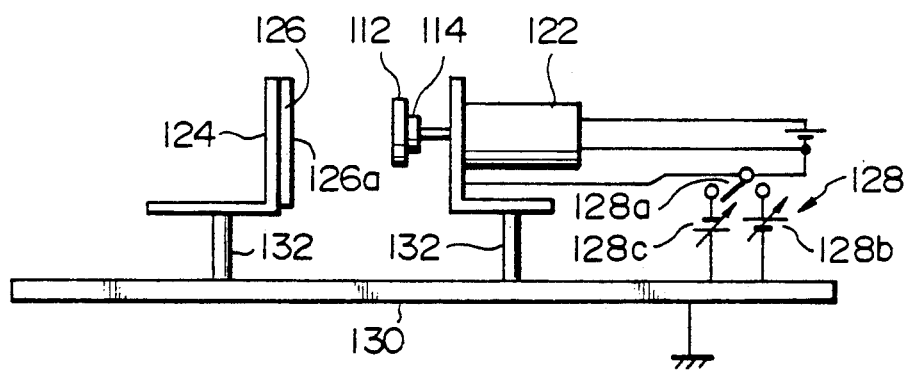

FIGS. 12 and 13 show an amorphous metal film producing apparatus.

As shown in FIGS. 12 and 13, a vacuum chamber 110 is evacuated at its interior by a non-illustrated pump. Inside the vacuum chamber 110, a target 112 for material of an amorphous film is mounted on a target holder 114, and laser light 116 from a non-illustrated laser light generator means is irradiated to the target 112 via a condenser lens 118 and a transmitting window 120. The target 112 is rotated at a constant speed by a d.c. motor 122 so that the target 112 is prevented from point damage due to focus of the laser light 116.

A substrate holder 124 is disposed in a confronting relationship to the target 112 with a predetermined distance therebetween. A substrate 126, on which particles evaporated from the target 112 are deposited to form a film 126a as described below, is mounted on the substrate holder 124. In the illustrated embodiment, glass is used for the substrate 126.

The substrate holder 124 is connected to the ground and the target holder 114 is connected to a d.c. power source 128, giving a desired potential difference between the target 112 and the substrate 126. The d.c. power supply 128 is composed of a switch 128a, a positive variable power supply 128b and a negative variable power supply 128c, keeping the target 112 at a desired potential.

This application of potential is performed on a single metal or alloy, such as of Fe or Ni, which requires a high cooling rate. The application of potential can increase the energy of the charged component in the evaporated material to increase the cooling rate of the evaporated material, can break the chemical bond in the deposited film 126a, can implant the high-energy evaporated material into the film to agitate the atom arrangement of the film 126a, thus making the film structure amorphous. If a positive potential is applied, the positively charged particles in the emitted material will be repelled, and the negatively charged particles will be accelerated. Reversely, if a negative potential is applied, the positively charged particles of the emitted material will be accelerated, and the negatively charged particles will be repelled.

Therefore, by applying the positive or negative potential, it is possible to increase the energy of the evaporated material, increase the cooling rate, breaking the chemical bond in the deposited film 126a and implant the high-energy evaporated material into the film 126a, thus making the film structure amorphous.

The substrate holder 124 and the target holder 114 are supported on a positioning rotary stage 130 via an insulator 132.

Experiment 1

To form an amorphous pure iron film, pure iron was mounted on the target holder 114, and then the interior of the vacuum chamber 110 was vacuumed at lower than $1 \times 10^{-5}$ Torr.

Then, using KrF excimer laser, which can produce a high output (wavelength of 249 nm, pulse width of 16 nsec, pulse frequency of 25 pulses/sec and pulse energy of 250 mJ), laser light 116 was irradiated to the target 112 of pure iron (99.999% purity) for 20 minutes while the target 112 was rotating at 20 rpm. The angle of irradiation of laser light with respect to the normal of the surface of the target holder 11 was about 45°, and the area of the laser light 116 irradiated on the pure-iron target 112 was about $6 \times 10^{-3}$ cm$^2$.

Subsequently, a predetermined potential is applied to the target holder 114 by the d.c. power supply 128. As a result, an amorphous pure-iron film 126a was formed on the glass substrate 126.

Figure 14A:
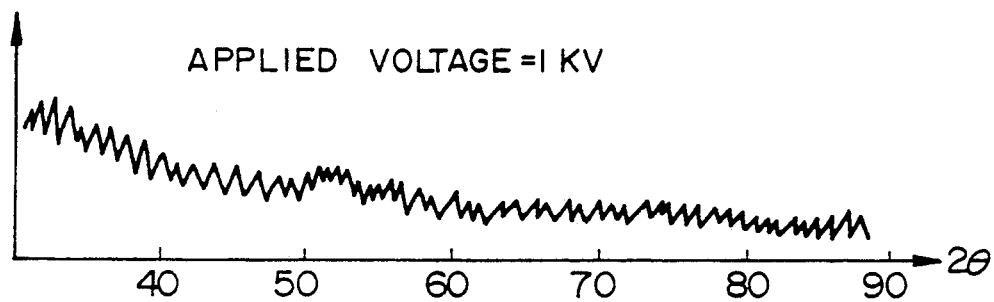
FIG. 14, (A), (B) and (C), is pattern diagrams showing the result of X-ray diffraction of a sample amorphous pure iron film.
Figure 14B:
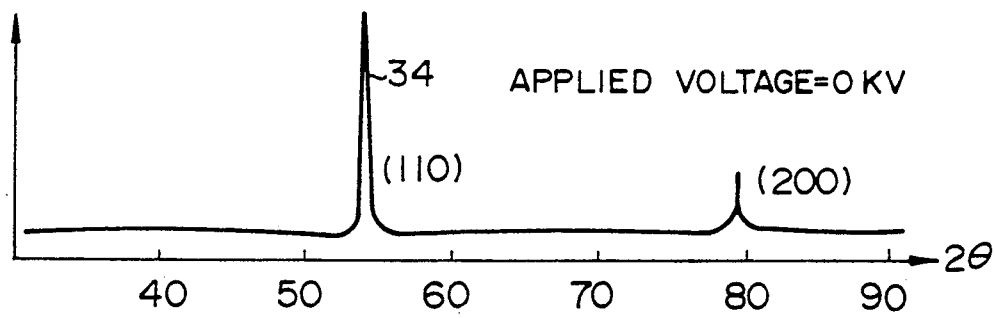
Figure 14C:
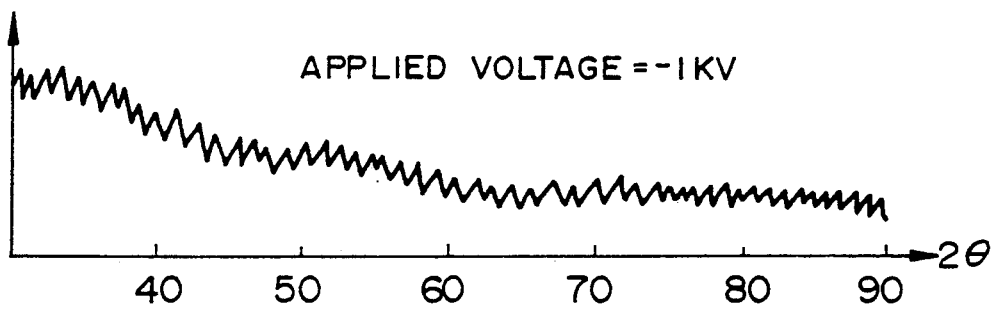

FIG. 14, (A), (B) and (C), shows the results of X-ray diffraction of the amorphous pure-iron film 126a when the applied voltage was 1 kV, 0 kV and −1 kV.

In FIG. 14, the horizontal coordinate represents the diffraction angle, and the vertical coordinate represents the diffraction intensity of X-ray. The X-ray diffraction pattern of the applied voltage 0 kV shows a crystal structure having a peak 34 on the (110) plane. However, with the films 126a when the applied voltage was 1 kV and −1 kV, their X-ray diffraction patterns were broad patterns each not having remarkable peaks, showing a noncrystalline structure.

Thus, because the high-energy evaporated material is forced into the film by application of electric field, it is possible to form an amorphous pure-iron film.

Figure 15:
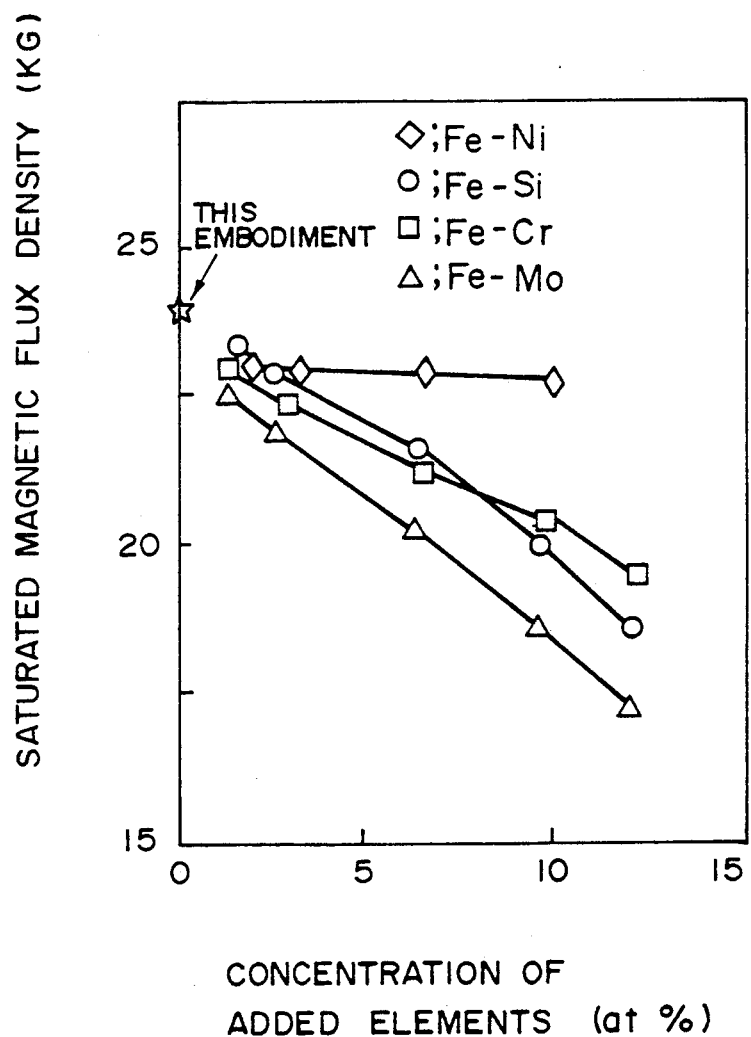
FIG. 15 is a characteristic diagram showing saturated magnetic densities of sample amorphous pure iron film and iron alloy film.

FIG. 15 shows the change of saturation magnetic flux densities when other metal elements were individually added to pure iron. According to the amorphous pure-iron film of this example, the saturation magnetic flux density was 24 kG, which was relatively large, compared to that with the case where another element such as Ni, Si, Cr or Mo was added to pure iron.

Accordingly, with the amorphous pure-iron film of this embodiment, it is possible to realize a high magnetic flux density, compared to the conventional alloy film. This amorphous pure-iron film is particularly suitable for various kinds of parts or devices such as transformers and magnetic heads.

Experiment 2

To form an amorphous tungsten (hereinafter called "W") film, pure W was mounted on the target holder 114, and then the interior of the vacuum chamber 110 was vacuumed at lower than $1 \times 10^5$ Torr.

Then, using KrF excimer laser, which can produce a high output (wavelength of 249 nm, pulse width of 16 nsec, pulse frequency of 25 pulses/sec and pulse energy of 250 mJ), laser light 116 was irradiated to the target 112 of pure tungsten (99.999% purity) for 20 minutes while the target 112 was rotating at 20 rpm. The angle of irradiation of laser light with respect to the normal of the surface of the target holder 114 was about 45°, and the area of the laser light 116 irradiated on the pure-W target 112 was about $6 \times 10^{-3}$ cm$^2$.

Subsequently, a predetermined potential is applied to the target holder 114 by the d.c. power supply 128. As a result, an amorphous pure-W film 126a was formed on the glass substrate 126.

FIG. 16, (A), (B) and (C), shows the results of X-ray diffraction of the amorphous pure-W film 126a when the applied voltage was 1 kV, 0 kV and −1 kV.

In FIGS. 16A–16C, the horizontal coordinate represents the diffraction angle, and the vertical coordinate represents the diffraction intensity of X-ray. The X-ray diffraction pattern of the applied voltage 0 kV shows a crystal structure having a peak 34 on the (110) plane. However, with the films 126a when the applied voltage was 1 kV and −1 kV, their X-ray diffraction patterns were broad patterns each not having remarkable peaks, showing a noncrystalline structure.

Thus, because the high-energy evaporated material is forced into the film by application of electric field, it is possible to form an amorphous pure-W film.

According to this invention, it is possible to form an amorphous film of pure iron and pure W as well as another metal or alloy having a critical cooling rate lower than that of pure iron.

The target material used in this invention is an element capable of allotropically transforming, namely an element performing a mutual transformation by itself. Element embodying this invention comprise the crystal systems of W (tungsten) γ having a phase of α, β and Fe (iron) having phases of α, ε and δ. These element are used as targets having a desired crystal phase. Specifically regarding the W system, by extracting the single α phase in W, the electric resistance can be reduced in comparison with mixed phase of α and β, thereby providing an excellent wiring composition.

What is claimed is:

1. A laser deposition apparatus comprising:
   (a) an airtight chamber for keeping an interior thereof at a reduced pressure;
   (b) a target holder disposed in the interior of said chamber for holding a target having a target surface to be irradiated;
   (c) a laser for outputting laser light;
   (d) a focusing means for focusing the laser light from said laser to irradiate the focused laser light to a laser radiating point at the target surface, so as to cause an emitting material to emit from the target and so as to generate laser induced plasma;
   (e) a substrate holder for holding a substrate to which the emitting material emitted from the target is to be deposited; and (f) a direction selecting means, having an opening, disposed in a traveling path of the emitting material extending between said target holder and said substrate holder, said aperture of said direction selecting means selecting, from the emitting material that is emitted in a direction of a solid angle of 0.022 steradian with the normal to the target surface of the target, the laser radiating point being the center of the solid angle of 0.022 steradian.

2. A laser deposition apparatus according to claim 1, wherein said target holder is mounted on a rotary table which is angularly movable to vary the angle of irradiation of the laser light to the target.

3. A laser deposition apparatus according to claim 1, wherein said direction selecting means is a shielding plate having an opening at a predetermined position.

4. A laser deposition apparatus according to claim 1, further comprising a velocity selecting means disposed in the traveling path of the emitting material for selecting, from the emitting material emitted from the target, a part of the emitting material that is emitted at a predetermined velocity, said velocity selecting means including a chopping element through which the emitting material is allowed to pass only for a predetermined period of time, the laser light to be irradiated to the target being pulse laser light.

5. A laser deposition apparatus according to claim 4, wherein said chopper element includes a plate having a predetermined opening, and a motor for angularly moving said plate, said chopper element being disposed in the traveling path of the emitting material during the predetermined period of time and operable to allow the emitting material to pass therethrough only for the predetermined period of time.

6. A laser deposition apparatus according to claim 5, wherein said direction selecting means is a shielding plate and the opening of said direction selecting means is at a predetermined position at the shielding plate.

7. A laser deposition apparatus according to claim 6, wherein said target holder is mounted on a rotary table which is angularly movable to vary the angle of irradiation of the laser light to the target.

8. A laser deposition apparatus according to claim 1, further comprising an emitting-material controlling means for controlling the state of the emitting material emitted from the target.

9. A laser deposition apparatus according to claim 8, wherein said emitting-material controlling means is a voltage applying means for applying a predetermined d.c. voltage between the target and the substrate.

10. A laser deposition apparatus according to claim 9, wherein said voltage applying means is capable of varying the predetermined d.c. voltage to be applied.

11. A laser deposition apparatus according to claim 8, further comprising a velocity selecting means disposed in the traveling path of the emitting material for selecting, from the emitting material emitted from the target, a part of the emitting material that is emitted at a predetermined velocity, wherein said target holder is mounted on a rotary table which is angularly movable to vary the angle of irradiation of the laser light to the target.

12. A laser deposition apparatus comprising:
(a) an airtight chamber for keeping an interior thereof at a reduced pressure;
(b) a target holder disposed in the interior of said chamber for holding a target having a target surface to be irradiated;
(c) a laser for outputting laser light;
(d) a focusing means for focusing the laser light from said laser to irradiate the focused laser light to a laser radiating point at the target surface, so as to cause an emitting material to emit from the target and so as to generate laser induced plasma;
(e) a substrate holder for holding a substrate to which the emitting material emitted from the target is to be deposited; and
(f) a velocity selecting means, disposed in a traveling path of the emitting material extending between said target holder and said substrate holder, for selecting, from the emitting material emitted from the target, only a part of the emitting material that is emitted at a predetermined velocity in a direction of a solid angle of 0.022 steradian with the normal to the target surface of the target, the laser radiating point being the center of the solid angle of 0.022 steradian.

13. A laser deposition method comprising:
(a) placing a target having a target surface and a substrate in a chamber, wherein the interior of the chamber is kept at a reduced pressure;
(b) focusing laser light and irradiating said light onto the target surface at a selected region to cause an emitting material to emit from the target and generate a laser induced plasma;
(c) selecting, from the emitting material emitted from the target, only a part of the emitting material that is emitted in a direction of a solid angle of 0.022 steradian with respect to a normal to the target surface which intersects the selected region of the target surface; and
(d) depositing the selected emitting material onto the substrate.

14. A laser deposition method according to claim 13, wherein the target comprises tungsten.

15. A laser deposition method according to claim 13, wherein the target is composed of separate portions of copper and iron.

16. A laser deposition method according to claim 13, wherein the laser light to be irradiated to the target is pulsed laser light.

17. A laser deposition method according to claim 16, further including: selecting, from the emitting material emitted from the target, a part of the emitting material that is emitted only at a predetermined velocity.

18. A laser deposition method according to claim 13, further comprising: applying a predetermined d.c. voltage between the target and the substrate; and controlling the state of the emitting material emitted from the target.

19. A laser deposition method according to claim 17, further comprising: applying a predetermined direct voltage between the target and the substrate; and controlling the state of the emitting material emitted from the target.

20. A laser deposition method according to claim 13, wherein said part of the emitting material to be selected in said selecting step is that part emitted only to a predetermined velocity.

21. A laser deposition method according to claim 13, wherein the target comprises an element capable of allotropically transforming.

22. A laser deposition method according to claim 21, wherein the target is tungsten.

23. A laser deposition method according to claim 13, wherein the target is composed of separate portion of copper and iron.

* * * * *

UNITED STATES PATENT AND TRADEMARK OFFICE
CERTIFICATE OF CORRECTION

PATENT NO. : 5,126,165
DATED : June 30, 1992
INVENTOR(S) : Akihama et al.

It is certified that error appears in the above-indentified patent and that said Letters Patent is hereby corrected as shown below:

Column 17, line 5, after "material" insert --emitted from the target, only a part of the emitting material--.

Signed and Sealed this

Twenty-third Day of August, 1994

Attest:

BRUCE LEHMAN

*Attesting Officer*    *Commissioner of Patents and Trademarks*